(12) United States Patent
Spano et al.

(10) Patent No.: US 6,750,544 B1
(45) Date of Patent: Jun. 15, 2004

(54) METALLIZATION SYSTEM FOR USE IN A SEMICONDUCTOR COMPONENT

(75) Inventors: John D. Spano, Austin, TX (US); John Lee Nistler, Martindale, TX (US)

(73) Assignee: Advanced Micro Devices, Sunnyvale, CA (US)

( * ) Notice: Subject to any disclaimer, the term of this patent is extended or adjusted under 35 U.S.C. 154(b) by 0 days.

(21) Appl. No.: 10/208,984

(22) Filed: Jul. 31, 2002

(51) Int. Cl.[7] ............................................... H01L 23/52
(52) U.S. Cl. ..................... 257/758; 257/760; 257/750; 257/773
(58) Field of Search ................................ 257/758, 760, 257/774, 750, 773

(56) References Cited

U.S. PATENT DOCUMENTS

| | | | |
|---|---|---|---|
| 6,207,577 B1 | 3/2001 | Wang et al. | 438/706 |
| 6,222,269 B1 * | 4/2001 | Usami | 257/758 |
| 6,235,628 B1 | 5/2001 | Wang et al. | 438/638 |
| 6,294,833 B1 * | 9/2001 | Usami | 257/758 |
| 6,380,091 B1 | 4/2002 | Wang et al. | 438/706 |
| 6,383,919 B1 | 5/2002 | Wang et al. | 438/638 |
| 6,388,330 B1 | 5/2002 | Ngo et al. | 257/760 |
| 6,525,428 B1 * | 2/2003 | Ngo et al. | 257/774 |
| 2002/0024150 A1 * | 2/2002 | Farrar | 257/786 |
| 2002/0089063 A1 * | 7/2002 | Ahn et al. | 257/762 |
| 2003/0001264 A1 * | 1/2003 | Naik | 257/751 |

* cited by examiner

*Primary Examiner*—Nathan J. Flynn
*Assistant Examiner*—Pershelle Greene
(74) *Attorney, Agent, or Firm*—Paul Drake; Rennie William Dover

(57) ABSTRACT

A metallization system (10) suitable for use in a semiconductor component and a method for fabricating the metallization system (10). The metallization system (10) includes a dielectric material (20) disposed on a major surface (14) of a substrate (12). The dielectric material (20) contains a dielectric filled plug (26) over a conductor (19). A metal filled plug (38) extends through the dielectric filled plug (26). The metal of the metal filled plug (38) electrically contacts the conductor (19). The metallization system (10) may be fabricated by etching a via (24) in the dielectric material (20) and filling the via (24) with a dielectric material (26) having a dielectric constant that is greater than the dielectric constant of the dielectric material (20) disposed on the major surface. A via (34) is formed in the dielectric material (26) that fills the via (24) and the via (34) is filled with a metal.

8 Claims, 3 Drawing Sheets

METALLIZATION SYSTEM FOR USE IN A SEMICONDUCTOR COMPONENT

FIELD OF THE INVENTION

This invention relates, in general, to a semiconductor component and, more particularly, to a metallization system in a semiconductor component

BACKGROUND OF THE INVENTION

Semiconductor component manufacturers are constantly striving to increase the speed of the components they manufacture. Because a semiconductor component, such as a microprocessor, contains up to a billion transistors or devices, manufacturers have focused on decreasing the gate delays of the semiconductor devices to increase speed. As a result, manufacturers have decreased the gate delays such that speed is now primarily limited by the propagation delay of the metallization system used to interconnect the devices. Metallization systems are typically comprised of a plurality of metallic interconnect layers electrically isolated from each other by a dielectric material. A figure of merit describing the delay of the metallization system is the Resistor-Capacitance (RC) delay of the metallization system. The RC delay can be derived from the resistance of the metal layer and the associated capacitance between different layers of metal in the metallization system. More particularly, the RC delay is given by:

$$RC = (\rho * \in * l^2 / (t_m * t_{diel}))$$

where:

ρ is the resistivity of the metallic interconnect layer;

∈ is the dielectric constant or permittivity of the dielectric material;

l is the length of the metallic interconnect;

$t_m$ is the thickness of the metal; and $t_{ox}$ is the thickness of the dielectric material.

Thus, to decrease the RC delay, either the resistivity of the metallic interconnect layer, the dielectric constant of the dielectric material, the length of the metal interconnect, or a combination thereof need to be decreased. Alternatively, the RC delay can be decreased by increasing the thickness of the metallic interconnect and/or the thickness of the dielectric material. The most practical parameter to optimize is the dielectric constant of the dielectric material. To lower the dielectric constant, semiconductor manufacturers have been developing dielectric materials having a low dielectric constant, i.e., a low κ. However, the drawbacks of using low κ dielectric materials is that they are difficult to resolve into small contacts because of etch selectivity problems, they create particles when polished that contaminate the device, and these types of materials are very fragile.

Accordingly, what is needed is a structure and method for forming a metallization system that decreases the propagation delay by decreasing the dielectric constant of the dielectric material portion of the metallization system.

SUMMARY OF THE INVENTION

The present invention satisfies the foregoing need by providing a metallization system and a method for forming the metallization system, wherein the metallization system is suitable for use in a semiconductor component. In accordance with one embodiment, the metallization system comprises a substrate having a major surface and a metal-1 conductor disposed on a first portion of the major surface. A first dielectric material is disposed on a second portion of the major surface, which is adjacent to the first portion of the major surface. A second dielectric material is disposed on the conductor and a third portion of the major surface, which third portion is between the first and second portions. The dielectric constant of the first dielectric material is less than the dielectric constant of the second dielectric material. A conductive material extends through the second dielectric material and is electrically coupled to the conductor. A metal-2 conductor is disposed on the conductive material such that it is coupled to the metal-1 conductor by the conductive material extending through the second dielectric material.

In accordance with another embodiment, the present invention comprises a method for fabricating a metallization system. A substrate having a major surface is provided and a conductor is formed on a first portion of the major surface. A layer of low κ dielectric material is formed on the conductor and a second portion of the major surface. A via is formed through the first layer of dielectric material exposing a portion of the conductor and a portion of the major surface that is adjacent to the conductor. The via is filled with a dielectric material having a dielectric constant that is higher than the dielectric constant of the low κ dielectric material. The via is formed through the dielectric material having the higher dielectric constant and filled with an electrically conductive material. A conductor is formed on the electrically conductive material.

In accordance with yet another embodiment, the present invention comprises a method for manufacturing a metallization system suitable for use in a semiconductor component in which a substrate having a major surface is provided and a conductor is formed on a first portion of the major surface. A first layer of dielectric material is formed on the first conductor and the major surface. A portion of the dielectric material is removed and exposes a second portion of the major surface. The first layer of dielectric material is disposed on the conductor and a third portion of the major surface. The third portion is between the first and second portions. A second layer of dielectric material is formed on the second portion of the major surface. The first layer of dielectric material has a higher dielectric constant than the second layer of dielectric material. A via is formed through the second layer of dielectric material and filled with an electrically conductive material. A conductor is formed on the electrically conductive material.

BRIEF DESCRIPTION OF THE DRAWINGS

The present invention will be better understood from a reading of the following detailed description, taken in conjunction with the accompanying drawing figures in which like references designate like elements and in which.

DETAILED DESCRIPTION

Generally, the present invention provides a metallization system particularly suited to a semiconductor component and a method for fabricating the metallization system. In accordance with one embodiment, a layer of dielectric material is disposed on a substrate having a conductive interconnect formed thereon. The layer of dielectric material has a low dielectric constant, i.e., the material is a low κ dielectric material. A via is formed in the dielectric material and filled with a dielectric material having a high dielectric constant, i.e., a high κ dielectric material. A via is formed in the high κ dielectric material and filled with an electrically conductive material to form a conductive plug. An electrically conductive layer is formed on the high κ dielectric material such that the conductive plug couples the upper conductive material to the lower conductive material. In another embodiment, a layer of high κ dielectric material is disposed on a substrate having a conductive interconnect formed thereon. A portion of the layer of high κ dielectric material is removed to form an opening, wherein the portion is adjacent to the conductive interconnect. The opening is filled with a low κ dielectric material. A via is formed in the remaining portion of the high κ dielectric material and filled with an electrically conductive material to form a conductive plug. An electrically conductive layer is formed on the high κ dielectric material such that the conductive plug couples the upper conductive material to the lower conductive material.

Figure 1:
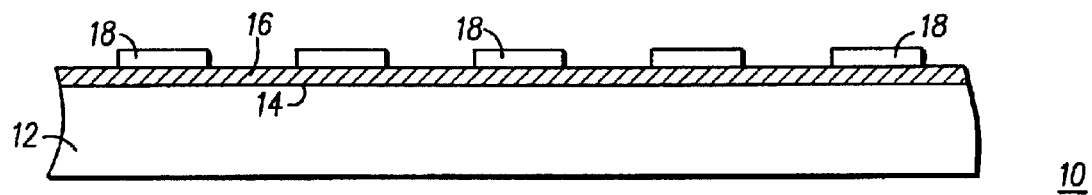
FIGS. 1–6 are cross-sectional side views of a portion of a semiconductor component during manufacture in accordance with a first embodiment of the present invention.

FIG. 1 is an enlarged cross-sectional side view of a portion of a semiconductor component 10 at an early stage of manufacture in accordance with a first embodiment of the present invention. What is shown in FIG. 1 is a substrate 12 having a major surface 14. Substrate 12 may be a semiconductor substrate, a ceramic substrate, a portion of an interconnect structure formed on a semiconductor substrate, or the like. A layer of conductive material 16 is formed on major surface 14. Suitable materials for layer of conductive material 16 include copper, a copper alloy, aluminum, an aluminum alloy, gold, silver, compounds thereof, combinations thereof, and the like. Layer of conductive material 16 has a thickness ranging between approximately 200 Angstroms (Å) and approximately 3,500 Å depending on the conductive material. A patterned masking layer 18 is formed on conductive material 16 to form the desired pattern from conductive layer 16. By way of example, patterned masking layer 18 is photoresist. The lengths, widths, and thicknesses of the conductors formed from conductive layer 16 are selected in accordance with the current densities the patterned conductive material will support. Conductive layer 16 is also referred to as metal-1.

Figure 2:
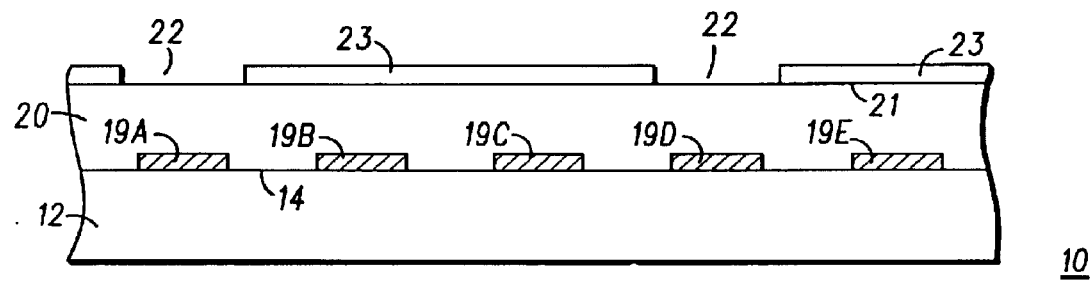

Referring now to FIG. 2, conductive layer 16 is etched to form the desired metal pattern on surface 14. In other words, conductive layer 16 is patterned to form conductors 19A, 19B, 19C, 19D, and 19E. Techniques for patterning metal layers are known to those skilled in the art. A layer of dielectric material 20 having a dielectric constant less than 3.9 and a thickness ranging from approximately 800 Å to approximately 8,000 Å is formed on the exposed portions of major surface 14 and conductors 19A–19E. Layer of dielectric material 20 has a surface 21. Suitable low dielectric constant (low κ) dielectric materials having a dielectric constant less than 3.9 include bis-benzocyclobutene (BCB), polyfluorotetraethylene (PTFE), poly(alylene) ethers (PAE), fluoro-polyimides, fluorinated tetraethoxysilane (FTEOS), methyl silsesquioxane (MSQ), hydrogen silsesquioxane (HSQ), hydrido organo siloxan polymer (HOSP), parylene (poly-p-xlylylene), fluorinated parylene, and nanoporous silica xerogel materials. Delectric layer 20 is planarized using a polishing process such as, for example, chemical mechanical planarization, mechanical planarization, electrochemical/mechanical planarization, or combinations thereof.

Still referring to FIG. 2, a layer of photoresist 23 is patterned on low κ dielectric layer 20 to have openings 22 that expose the portions of low κ dielectric layer 20 above conductors 19A and 19D. Techniques for depositing and patterning photoresist are known to those skilled in the art. It should be understood that the particular conductors exposed is not a limitation of the present invention, i.e., one or any combination of conductors 19A–19E could have been exposed.

Figure 3:
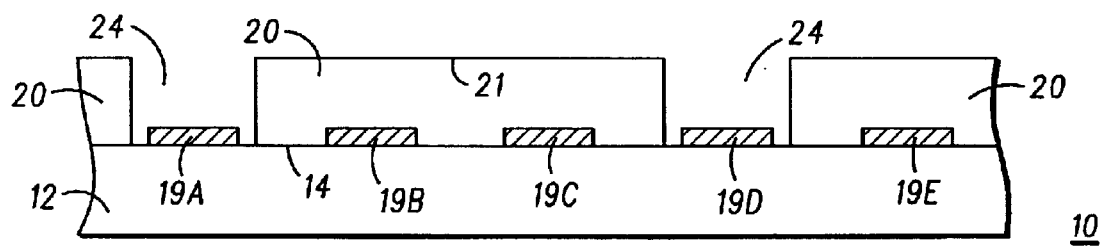

Referring now to FIG. 3, the portions of low κ dielectric layer 20 exposed by vias 22 are anisotropically etched to form vias 24 that expose conductors 19A and 19D and the portions of major surface 14 adjacent to conductors 19A and 19D. Because conductors 19A and 19D are elongated interconnect structures or conductive traces, vias 24 are preferably trenches formed to expose conductors 19A and 19D.

Figure 4:
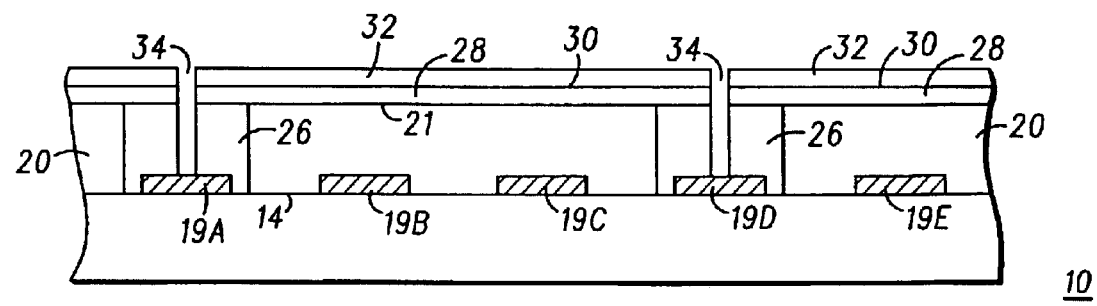

Referring now to FIG. 4, vias 24 are filled with a dielectric material 26 having a dielectric constant greater than 3.9. Dielectric materials having dielectric constants greater than approximately 3.9 are referred to as high κ dielectrics: Suitable high κ dielectric materials include silicon oxide ($SiO_x$), tetraethoxysilane (TEOS), borophosphotetraethylorthosilicate (BPTEOS) glass, borophosphosilicate glass (BPSG), silicon nitride ($Si_xN_y$), or the like. Suitable techniques for forming dielectric material 26 include spin-on processes, deposition, and the like. Dielectric material 26 is planarized so that it is coplanar with surface 21 of dielectric layer 20. By way of example, dielectric material 26 is planarized using a chemical mechanical planarization (CMP) technique.

A capping layer 28 is formed on surface 21 and dielectric material 26. By way of example, capping layer 28 is silicon nitride having a surface 30 and a thickness ranging from approximately 1,000 Å to 15,000 Å. Preferably, capping layer 28 has a thickness ranging from approximately 2,500 Å to 5,500 Å. A layer of photoresist 32 is patterned on capping layer 28 and has vias that expose portions of capping layer 28. Vias 34 are etched into capping layer 28 and a portion of dielectric material 26 to expose portions of conductors 19A and 19D. Preferably, photoresist 32 is patterned such that vias 34 are substantially centered within dielectric material 26.

Figure 5:
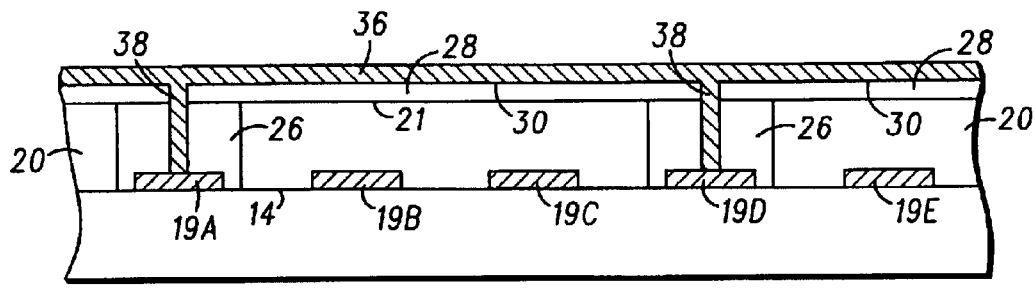

Referring now to FIG. 5, layer of photoresist 32 is removed and a layer of metal 36 is formed on surface 30 to fill vias 34 with metal plugs 38. By way of example metal layer 36 is copper.

Figure 6:
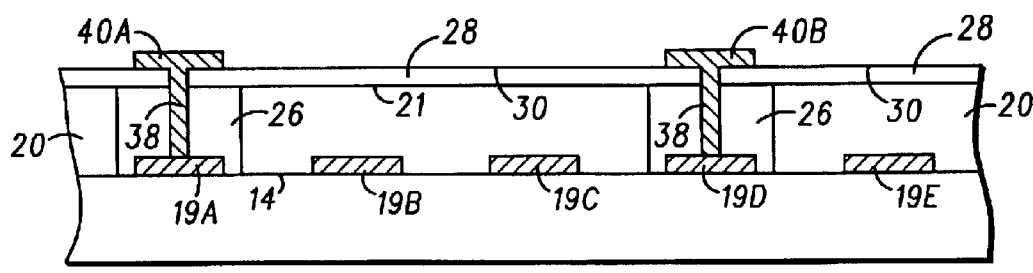

Referring now to FIG. 6, metal layer 36 is planarized using a CMP technique. A layer of conductive material is formed on surface 30. Suitable materials for the layer of conductive material include copper, a copper alloy, aluminum, an aluminum alloy, gold, silver, compounds thereof, combinations thereof, and the like. The layer of conductive material has a thickness ranging between approximately 1,000 Å and approximately 5,500 Å. The layer of conductive material is patterned to form conductors 40A and 40B. The lengths, widths, and thicknesses of the conductors formed from the layer of conductive material are selected in accordance with the current densities the patterned conductive material will support. The conductive layer from which conductors 40A and 40B are formed is also referred to as metal-2. It should be understood that referring to the metal layers as metal-1 and metal-2 is not a limitation of the present invention. The metal layers could be the second and third metal layers, third and fourth metal layers, the fourth and fifth metal layers, the fifth and sixth metal layers, the first and fourth metal layers, the second and fourth metal layers, etc.

Figure 7:
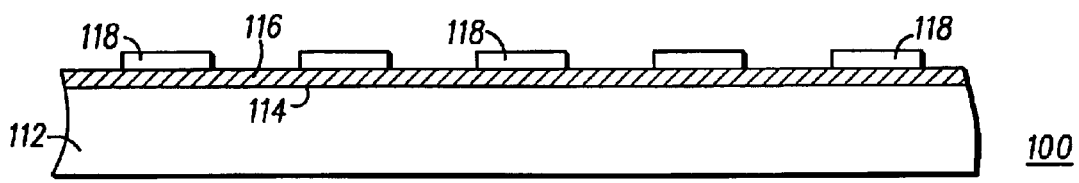
FIGS. 7–12 are cross-sectional side views of a portion of a semiconductor component during manufacture in accordance with a second embodiment of the present invention.

FIG. 7 is an enlarged cross-sectional side view of a portion of a semiconductor component 100 at an early stage of manufacture in accordance with a second embodiment of the present invention. What is shown in FIG. 7 is a substrate 112 having a major surface 114. Substrate 112 may be a semiconductor substrate, a ceramic substrate, or a portion of an interconnect structure formed on a semiconductor substrate. A layer of conductive material 116 is formed on major surface 114. Suitable materials for layer of conductive material 116 include copper, a copper alloy, aluminum, an aluminum alloy, gold, silver, compounds thereof, combinations thereof, and the like. Conductive material 116 has a thickness ranging between approximately 200 Å and approximately 3,500 Å. A patterned masking layer 118 is formed on conductive material 116 to form the desired pattern from conductive layer 116. By way of example, patterned masking layer 118 is photoresist. The lengths, widths, and thicknesses of the conductors formed from conductive material 116 are selected in accordance with the current densities the patterned conductive material will support. Conductive material 116 is also referred to as metal-1.

Figure 8:
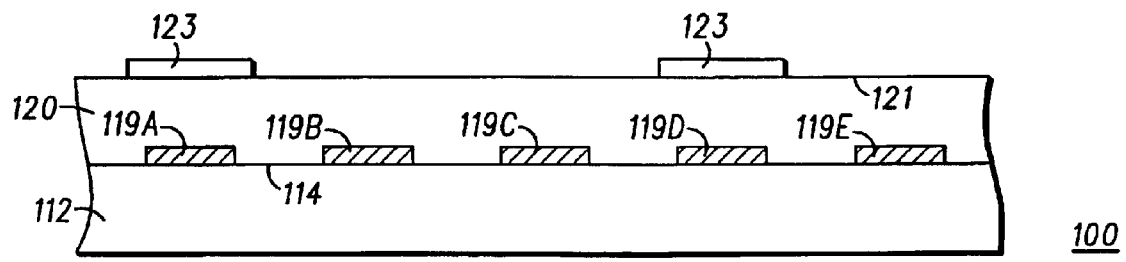

Referring now to FIG. 8, conductive material 116 is etched to form the desired metal pattern on surface 114. In other words, layer of conductive material 116 is patterned to form conductors 119A, 119B, 119C, 119D, and 119E. Techniques for patterning metal layers are known to those skilled in the art. A layer of dielectric material 120 having a dielectric constant greater than about 3.9 and a thickness ranging from approximately 800 Å to approximately 8,000 Å is formed on the exposed portions of major surface 114 and conductors 119A–119E. Layer of dielectric material 120 has a surface 121. Suitable high κ dielectric materials having a dielectric constant greater than about 3.9 include silicon oxide ($SiO_x$), tetraethoxysilane (TEOS), borophosphotetraethylorthosilicate (BPTEOS) glass, borophosphosilicate glass (BPSG), silicon nitride ($Si_xN_y$), or the like. A layer of photoresist is patterned on layer of dielectric material 120 to form etch masks 123. Preferably, etch masks 123 are vertically aligned with conductors 119A and 119B.

Figure 9:
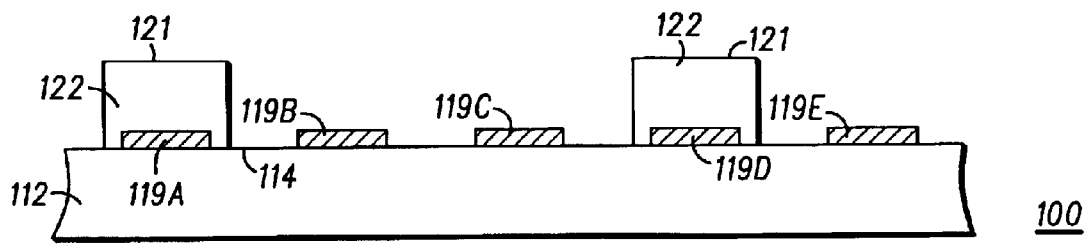

Referring now to FIG. 9, layer of dielectric material 120 is etched to expose conductors 119B, 119C, 119E, and the portions of surface 114 adjacent to conductors 119B, 119C, and 119E. The remaining portions of layer of dielectric material 120 form dielectric columns 122.

Figure 10:
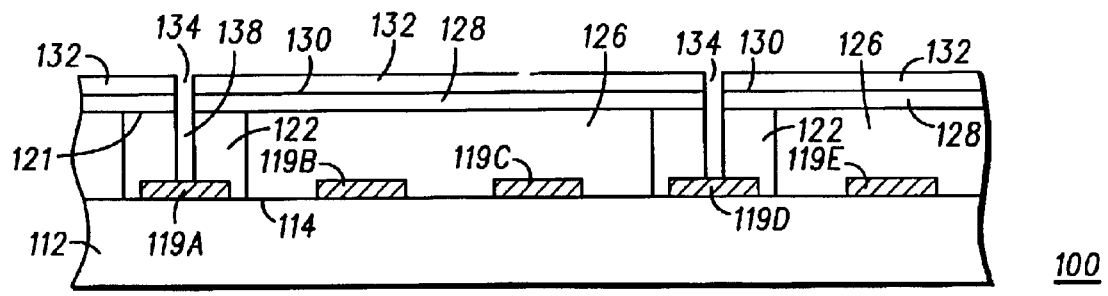

Referring now to FIG. 10, a layer of dielectric material 126 having a dielectric constant less than about 3.9 is deposited on conductors 119B, 119C, 119E, the exposed portions of surface 114, and on dielectric columns 122. Dielectric layers having dielectric constants less than about 3.9 are referred to as low κ dielectrics. Dielectric material 126 is planarized so that it is coplanar with surfaces 121 of dielectric columns 122. By way of example, dielectric material 126 is planarized using a chemical mechanical planarization (CMP) technique.

A capping layer 128 is formed on surface 121 and the planarized surface of dielectric material 126. By way of example, capping layer 128 is silicon nitride having a surface 130 and a thickness ranging from approximately 1,000 Å to approximately 15,000 Å. Preferably, capping layer 128 has a thickness ranging from approximately 2,500 Å to approximately 5,500 Å. A layer of photoresist 132 is patterned on capping layer 128 to have openings that expose portions of capping layer 128. Vias 134 are etched into capping layer 128 and a portion of columns 122 to expose portions of conductors 119A and 119D. Preferably, photoresist 132 is patterned such that vias 134 are substantially centered within the dielectric material of dielectric columns 122.

Figure 11:
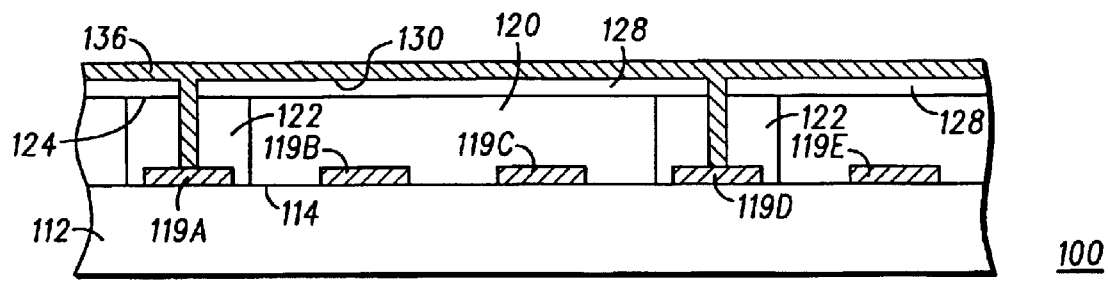

Referring now to FIG. 11, layer of photoresist 132 is removed and a layer of metal 136 is formed on surface 130 to fill vias 134 with metal plugs 138. By way of example metal layer 136 is copper.

Figure 12:
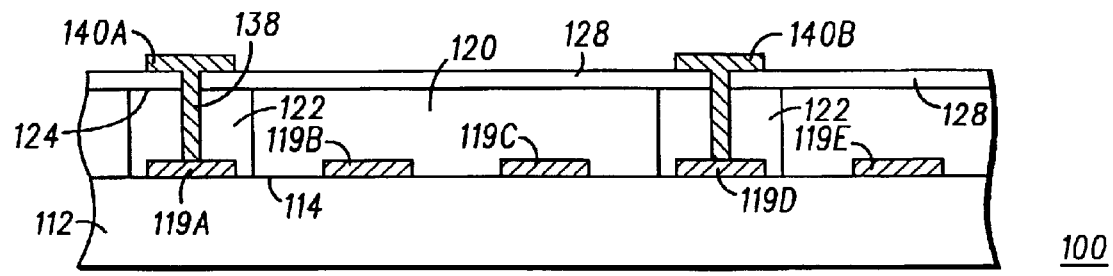

Referring now to FIG. 12, metal layer 136 is planarized using a CMP technique. A layer of conductive material is formed on surface 130. Suitable materials for the layer of conductive material include copper, a copper alloy, aluminum, an aluminum alloy gold, silver, compounds thereof, combinations thereof, and the like. The layer of conductive material has a thickness ranging between approximately 1,000 Å and approximately 5,500 Å. The layer of conductive material is patterned to form conductors 140A and 140B. The lengths, widths, and thicknesses of the conductors formed from the layer of conductive material are selected in accordance with the current densities the patterned conductive material will support. The conductive layer from which conductors 140A and 140B are formed is also referred to as metal-2. It should be understood that referring to the metal layers as metal-1 and metal-2 is not a limitation of the present invention. The metal layers could be the second and third metal layers, the third and fourth metal layers, the fourth and fifth metal layers, the fifth and sixth metal layers, the first and fifth metal layers, the second and fourth metal layers, etc.

By now it should be appreciated that a metallization system suitable for use in a semiconductor component and a method for fabricating the metallization system have been provided. The metallization system incorporates a low κ dielectric material for more than half of the dielectric material present in the metallization system. Because the high κ dielectric material surrounds the vertically oriented interconnects rather than all the electrical interconnects, the overall capacitance is lowered, thereby lowering the RC delay. An advantage of using the high κ dielectric material around the vertically oriented electrical interconnects is that they serve as columns or pillars that increase the structural integrity of the metallization system. Another advantage is that the higher κ dielectric materials are typically deposited films such as plasma enhanced BPTEOS. Plasma deposition of these dielectric materials improves crystalline uniformity and density, thereby allowing a more anisotropic etch, a potentially more selective etch stop, and the ability to deposit an etch stop.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A metallization system suitable for use in a semiconductor component, comprising:

a substrate having a major surface;

a conductor disposed on a first portion of the major surface;

a first dielectric material having a first dielectric constant and a first dielectric surface disposed on a second portion of the major surface, the second portion adjacent the first portion;

a second dielectric material having a second dielectric constant and a second dielectric surface disposed on the conductor and a third portion of the major surface, the third portion between the first and second portions; and a conductive material extending through the second dielectric material and electrically coupled to the conductor.

2. The metallization system of claim 1, further including a dielectric layer disposed on the first dielectric surface and the second dielectric surface.

3. The metallization system of claim 2, further including a second conductor, the second conductor disposed on the dielectric layer and electrically coupled to the conductive material.

4. The metallization system of claim 1, wherein the value of the first dielectric constant is greater than the value of the second dielectric constant.

5. The metallization system of claim 4, wherein the dielectric constant of the first dielectric material is less than about 3.9 and the dielectric constant of the second dielectric material is less than about 3.9.

6. The metallization system of claim 1, wherein the first dielectric material is selected from the group of dielectric materials consisting of bis-benzocyclobutene (BCB), polyfluorotetraethylene, fluorinated tetraethoxysilane, methyl silsesquioxane, and hydrogen silsesquioxane.

7. The metallization system of claim 1, wherein the second dielectric material is selected from the group of dielectric materials consisting of silicon oxide, fluorinated tetraethoxysilane, borophosphotetraethylorthosilicate glass, borophosphosilicate glass, and silicon nitride.

8. The metallization system of claim 1, wherein the first dielectric material has a thickness ranging from 1,000 Å to 15,000 Å.

* * * * *